(12) United States Patent
Carinci et al.

(10) Patent No.: US 10,578,697 B2
(45) Date of Patent: Mar. 3, 2020

(54) METHOD AND MAGNETIC RESONANCE APPARATUS USING A SPIN-ECHO SEQUENCE FOR THE SPATIALLY SELECTIVE ACQUISITION OF MAGNETIC RESONANCE DATA

(71) Applicant: Siemens Healthcare GmbH, Erlangen (DE)

(72) Inventors: Flavio Carinci, Erlangen (DE); Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 206 days.

(21) Appl. No.: 15/878,922

(22) Filed: Jan. 24, 2018

(65) Prior Publication Data
US 2018/0210051 A1 Jul. 26, 2018

(30) Foreign Application Priority Data
Jan. 25, 2017 (DE) .......................... 10 2017 201 157

(51) Int. Cl.
*G01R 33/54* (2006.01)

(52) U.S. Cl.
CPC .................................. *G01R 33/54* (2013.01)

(58) Field of Classification Search
CPC . G01R 33/54; G01R 33/5617; G01R 33/4835
See application file for complete search history.

(56) References Cited

U.S. PATENT DOCUMENTS

| 5,749,834 A | 5/1998 | Hushek |
| 5,767,676 A | 6/1998 | Schaffter et al. |
| 2002/0033698 A1 | 3/2002 | Heid |
| 2004/0263166 A1* | 12/2004 | Kluge .................. G01R 33/583 324/309 |
| 2015/0226823 A1* | 8/2015 | Speier .............. G01R 33/34092 324/309 |
| 2016/0033603 A1 | 2/2016 | Paul |
| 2016/0113501 A1* | 4/2016 | Hua ................... G01R 33/4806 600/420 |

* cited by examiner

*Primary Examiner* — Patrick Assouad
*Assistant Examiner* — Haidong Zhang
(74) *Attorney, Agent, or Firm* — Schiff Hardin LLP (57) ABSTRACT

In a method and apparatus for acquiring magnetic resonance (MR) data from multiple slices of a subject, a spin echo sequence is executed wherein a radio frequency (RF) excitation pulse, a refocusing pulse, and a further RF pulse are radiated, together with the application of a number of gradients, in order to acquire MR data from an intersection volume of a selected slice with a further slice. The MR data are entered into at least one k-space line in a memory organized as k-space.

20 Claims, 5 Drawing Sheets

METHOD AND MAGNETIC RESONANCE APPARATUS USING A SPIN-ECHO SEQUENCE FOR THE SPATIALLY SELECTIVE ACQUISITION OF MAGNETIC RESONANCE DATA

BACKGROUND OF THE INVENTION

Field of the Invention

The present invention concerns use of a spin echo sequence for acquiring magnetic resonance (MR) data quickly in a small part of a volume, with a magnetic resonance apparatus.

Description of the Prior Art

The acquisition of MR data with a magnetic resonance scanner and the entry of the acquired MR data into k-space is based on the condition that the spacing between k-space points in each direction fulfils the Nyquist sampling conditions (Nyquist sampling). As a result, appropriate coverage of a field of view in the image space is possible in order to avoid foldover artifacts. In some applications, however, only a small region of a volume segment is of interest. In this case, the acquisition of MR data ensues for a reduced field of view compared to the field of view that is required in order to avoid foldover artifacts, as a result of which the time for acquiring the MR data is reduced.

For the acquisition of MR data relating to a reduced field of view, techniques can be used to excite and/or refocus only a small region of the volume segment. A selective excitation in one spatial direction can be achieved by applying a suitably shaped radio-frequency (RF) pulse together with a corresponding magnetic field gradient. This technique is generally used in order excite one slice of the volume segment in order to generate a two-dimensional or three-dimensional image of the excited volume segment only.

A selective excitation in two spatial directions can be used to further reduce the field of view and hence the time for the acquisition of the MR data. In principle, this selective excitation occurs in two spatial directions in precisely the same way as the selective excitation in one spatial direction. However, in the selective excitation in two spatial directions, two variable magnetic field gradients have to be applied along two orthogonal spatial directions. For this selective excitation in two spatial directions, RF-pulses that last for a relatively long time are required, since the gradients have to cover a two-dimensional space. Parallel transmission techniques can be used here in order to shorten the duration of the RF pulses.

A different option for acquiring MR data in a field of view that is reduced in two spatial directions consists in combining a selective excitation in one direction with a selective refocusing along a different direction that is orthogonal thereto. This principle is used for three-dimensional spin echo imaging techniques, for example. However, this principle cannot be used to acquire MR data for a number of slices. In the acquisition of MR data in a specific slice, the respective refocusing pulse in fact also saturates the longitudinal magnetization in the adjacent slices, which would lead disadvantageously to a reduced signal amplitude if, after the specified slice, MR data were to be acquired in an adjacent slice.

SUMMARY OF THE INVENTION

An object of the present invention therefore is to solve this known problem in order to also acquire, with a spin echo sequence, MR data for a number of slices in a field of view that is reduced in two spatial directions.

In the context of the present invention, a method for the acquisition of MR data in a number of slices of a predetermined volume segment of an examination object with the aid of a magnetic resonance system is provided. In the method, MR data are acquired by operating an MR data acquisition scanner of a MR imaging apparatus with a computer so as to execute a spin echo sequence, with the spin echo sequence including the following steps.

A first magnetic field gradient is applied as a slice selection gradient along a first direction.

An RF excitation pulse is radiated for the selective excitation of a specified slice while the slice selection gradient is applied. Here the specified slice is one slice or a number of slices from which MR data are to be acquired according to the invention.

A second magnetic field gradient is applied as a slice-selection gradient along a second direction, wherein the second direction is at an angle ranging from 45° to 135° (preferably 90°) to the first direction.

A refocusing pulse is radiated while the second gradient is applied. By the emission of the refocusing pulse, spins in a further slice are inverted, wherein the further slice is at the aforementioned angle to the specified slice.

A third gradient is likewise applied along the second direction.

A further RF pulse is radiated while the third gradient is applied, in order to invert the spins in the further slice. Through the combination of the refocusing pulse and the further RF-pulse, the spins in the further slice, which are located outside the specified slice, are flipped back into their starting position by the double inversion. In other words, the spins that are located outside an intersection volume that pertains to the specified slice and also to the further slice (and corresponds to an intersection of the specified slice with further slice), and which are located inside the further slice, to the refocusing pulse and the RF-pulse, but not to the RF excitation pulse. As a result, these spins in the further slice outside the intersection volume which are located in parallel adjacent slices of the specified slice are flipped twice, by 180° for example, as a result of which they come back into their starting position. Conversely, the spins in the intersection volume near to the refocusing pulse and the further RF-pulse are also exposed to the RF excitation pulse.

Lastly, the MR data originating from nuclear spins in the intersection volume are acquired and entered into a memory organized as k-space along at least one k-space line, following the emission of the RF excitation pulse, the refocusing pulse and the further RF-pulse. Accordingly, starting from the respective RF excitation pulse, MR data are acquired only after the refocusing pulse and the further RF pulse have been emitted along with the RF excitation pulse.

The acquired data that have been entered into k-space are made available via the computer as a data file.

Through the procedure according to the invention (that is, through the selective radiation both of the refocusing pulse and of the further RF-pulse), the spins in the slices adjacent to the specified slice are either not affected at all if they are located outside the further slice, or experience a double inversion, through which they are again in their starting position if they are inside the further slice. Therefore, due to the fact that the longitudinal magnetization in the adjacent slices is not affected or the spins are inverted twice and thus brought back into their starting position, the longitudinal magnetization in the adjacent slices is virtually not saturated, as a result of which the magnetization (in particular the longitudinal magnetization) in the adjacent slices recovers far more quickly than is the case according to the prior art. As a result, the MR data in a number of slices that run in parallel can be acquired far more quickly than would be possible according to the prior art.

The flip angle of the refocusing pulse and of the further RF pulse is within a range from 155° to 205°, a flip angle of 180° being preferred. In each case, the sum of the flip angle of the refocusing pulse and of the flip angle of the further RF pulse should be 360°.

Preferably, crusher gradients are applied in the second direction directly before and directly after the second and third gradient in each case. In other words, directly before the second gradient, directly after the second gradient, directly before the third gradient and directly after the third gradient, a crusher gradient is applied in each case.

These crusher gradients ensure, in interaction with crusher gradients of further refocusing pulses, that any residual longitudinal magnetization is eliminated, as described in more detail hereinafter.

Before the acquisition of the at least one k-space line, a pre-focusing readout gradient is preferably applied along the readout direction that is preferably perpendicular on the first direction and on the second direction.

According to a preferred embodiment of the invention, the refocusing pulse and the further RF-pulse are adiabatic pulses, as a result of which the sensitivity of the method according to the invention to inhomogeneities in the transmission B1 field is reduced and signal losses can be minimized.

As has been mentioned, after the acquisition of the MR data in the pre-specified slice, MR data are preferably acquired along the k-space lines in others of the slices, wherein these other slices run parallel to the specified slice, that is, at intervals along the first direction.

According to a preferred embodiment of the invention, multiple k-space lines are acquired in the intersection volume following the omission of the RF excitation pulse. These k-space lines are acquired by carrying out the following steps a number of times:

A readout gradient is applied along a third direction, which is perpendicular on the first and the second directions.

The MR data are acquired along k-space lines, for each of which the readout gradient is applied.

A further refocusing pulse is radiated when the previous steps are carried out again.

According to this embodiment, the MR data are acquired with what are known as echo trains.

The acquisition of the MR data or the k-space lines can ensue in a Cartesian or a radial manner. With a Cartesian acquisition of the MR data, the k-space lines run parallel to each other, the readout gradient being essentially perpendicular for the first and the second directions. With a radial MR data acquisition, the k-space lines proceed radially inside the slice that is excited by the respective RF excitation pulse and in which the MR data are acquired, such that the k-space lines all intersect at one point. Radial MR data acquisition is also known as the Stack of Stars. Furthermore, the MR data or the k-space lines can also be acquired using methods such as BLADE or GRASE. Here BLADE corresponds to a technique known as PROPELLER ("Periodically Rotated Overlapping ParallEL Lines with Enhanced Reconstruction") in which k-space is sampled in a rotating manner using strips (blades) that proceed radially. GRASE ("GRadient And Spin Echo") is a hybrid technique that generates and acquires gradient echoes and spin echoes.

While the further refocusing pulse is radiated, a third gradient is applied along the first direction. As a result, the refocusing ensues selectively in each case inside the slice in which the MR data are acquired.

Directly before and directly after the respective third gradient, further crusher gradients can be applied.

These further crusher gradients should differ in amplitude from the crusher gradients described above for the second and third gradients.

If the crusher gradients for the refocusing pulse and the further RF-pulse differ in amplitude and/or direction from the further crusher gradients in the further refocusing pulses, any residual longitudinal magnetization after the radiation of the aforementioned RF-pulses is eliminated. This residual longitudinal magnetization would otherwise generate imaging artifacts due to the failure to satisfy the CPMG conditions ("Carr-Purcell-Meiboom-Gill" conditions).

The echo time, which is determined by these further refocusing pulses, can be constant for the echo train (that is, during the acquisition of the k-space lines starting from the same RF excitation pulse). Nevertheless, it is also possible for the echo times within the same echo train to vary in length, by varying the time lag between the further refocusing pulses.

In a similar manner, the k-space lines during a specific echo train can be acquired with the same phase encoding or with different phase encodings.

Usually, starting from a specific RF excitation pulse, a further refocusing pulse is first applied before a k-space line is selected for a specific RF excitation pulse. It is also possible according to the invention, however, to acquire a k-space line starting from the specific RF excitation pulse without a further refocusing pulse being radiated in advance. In this case, the further refocusing pulses are radiated in order to select further k-space lines starting from the further RF excitation pulse. It is also possible in this case, however, for no further refocusing pulse at all to be radiated if only one k-space line is selected per RF excitation pulse.

For the spin echo sequence according to the invention, there are two variants:

In the first variant, the RF excitation pulse is first radiated, then after the RF excitation pulse, the refocusing pulse is radiated and then after the refocusing pulse, the further RF-pulse is radiated as an additional refocusing pulse.

In the second variant, the further RF-pulse is first radiated as what is known as an inversion pulse, then after the further RF-pulse, the RF excitation pulse is radiated and after the RF excitation pulse, the refocusing pulse is radiated.

In the first variant there is a lower signal loss from the elimination of the residual longitudinal magnetization, which requires a longer echo time, however. The second variant makes it possible to have a shorter echo time, but there is a greater signal loss from the elimination of the residual longitudinal magnetization.

In the first variant, a first echo time, which is determined by the further RF-pulse, can be different from a second echo time, which is determined by the further refocusing pulses and which has previously been discussed as the echo time for the echo train. In other words, the first echo time, which is determined by the time lag between the refocusing pulse and the further RF-pulse, will differ from the (second) echo time in the echo train. It is also possible according to the invention, however, that in the first variant the first echo time is equal to the second echo time.

In a similar way, in the second variant, the first echo time, which is determined by the time lag between the RF excitation pulse and the refocusing pulse, can differ from the (second) echo time in the echo train. As in the first variant, it is also possible according to the invention for the first echo time to be equal to the second echo time.

In the second variant, preferably at least one spoiling gradient is applied between the further RF-pulse and the RF excitation pulse along one direction in order to eliminate signal components of the residual transversal magnetization after the further RF-pulse (inversion pulse). It is also possible, however, for two or three spoiling gradients to be applied between the further RF-pulse and the RF excitation pulse along two or three directions.

The present invention also encompasses a magnetic resonance apparatus for the acquisition of MR data relating to a number of slices of a predetermined volume segment of an examination object with the use of a spin echo sequence. The magnetic resonance apparatus has a basic field magnet, a gradient field system, at least one RF antenna and a control computer to activate the gradient field system and the at least one RF antenna, in order to receive measurement signals picked up by the RF antenna or antennas and for evaluating the measurement signals. The magnetic resonance apparatus is designed to activate the gradient field system with the control computer such that it activates a first gradient along a first direction and at the same time radiates an RF excitation pulse with the at least one RF antenna in order to selectively excite a specific one of the multiple slices. Furthermore, the magnetic resonance apparatus activates the gradient field system via the control computer such that a second gradient is applied along a second direction and at the same time, via the at least one RF antenna, a refocusing pulse is radiated with which spins in a further slice are inverted. Finally, the magnetic resonance system is designed so that the control computer activates the gradient field system such that a third gradient is applied along a second direction, and in order at the same time to radiate a further RF pulse with the at least one RF antenna in order to invert the spins in the further slice. The magnetic resonance apparatus acquires at least one k-space line in an intersection volume corresponding to the interface region composed of the specified slice and the further slice only after the emission of the RF excitation pulse, the refocusing pulse and the further RF pulse. Here, the first direction and the second direction form an angle ranging from 45° to 135° (preferably 90°). The spins in the slices parallel to the specified slice and hence outside the intersection volume are flipped back into their starting position by the combination of the refocusing pulse and the further RF pulse. In other words, the spins in the intersection volume are also exposed to the RF excitation pulse in addition to the refocusing pulse and the further RF pulse, whereas the spins outside the intersection volume but inside the further slice are only exposed to the refocusing pulse and the further RF pulse (and not to the RF excitation pulse).

The advantages of the magnetic resonance apparatus according to the invention essentially correspond to the advantages of the method according to the invention as described above in detail.

The present invention also encompasses a non-transitory, computer-readable data storage medium encoded with programming instructions that, when the storage medium is loaded into a computer or computer system of a magnetic resonance apparatus, cause the computer or computer system to operate the magnetic resonance apparatus in order to implement any or all embodiments of the method according to the invention, as described above.

The programming instruction can be formulated as source code (C++ for example), which still has to be compiled (translated) and linked up or just has to be interpreted, or an executable software code that only needs to be loaded into the computer or (distributively) computer system in order to run the program.

The electronically readable data-carrier can be, for example, a DVD, a magnetic tape, a hard disk, or a USB stick, on which electronically readable control data are stored.

DESCRIPTION OF THE PREFERRED EMBODIMENTS

Figure 1:
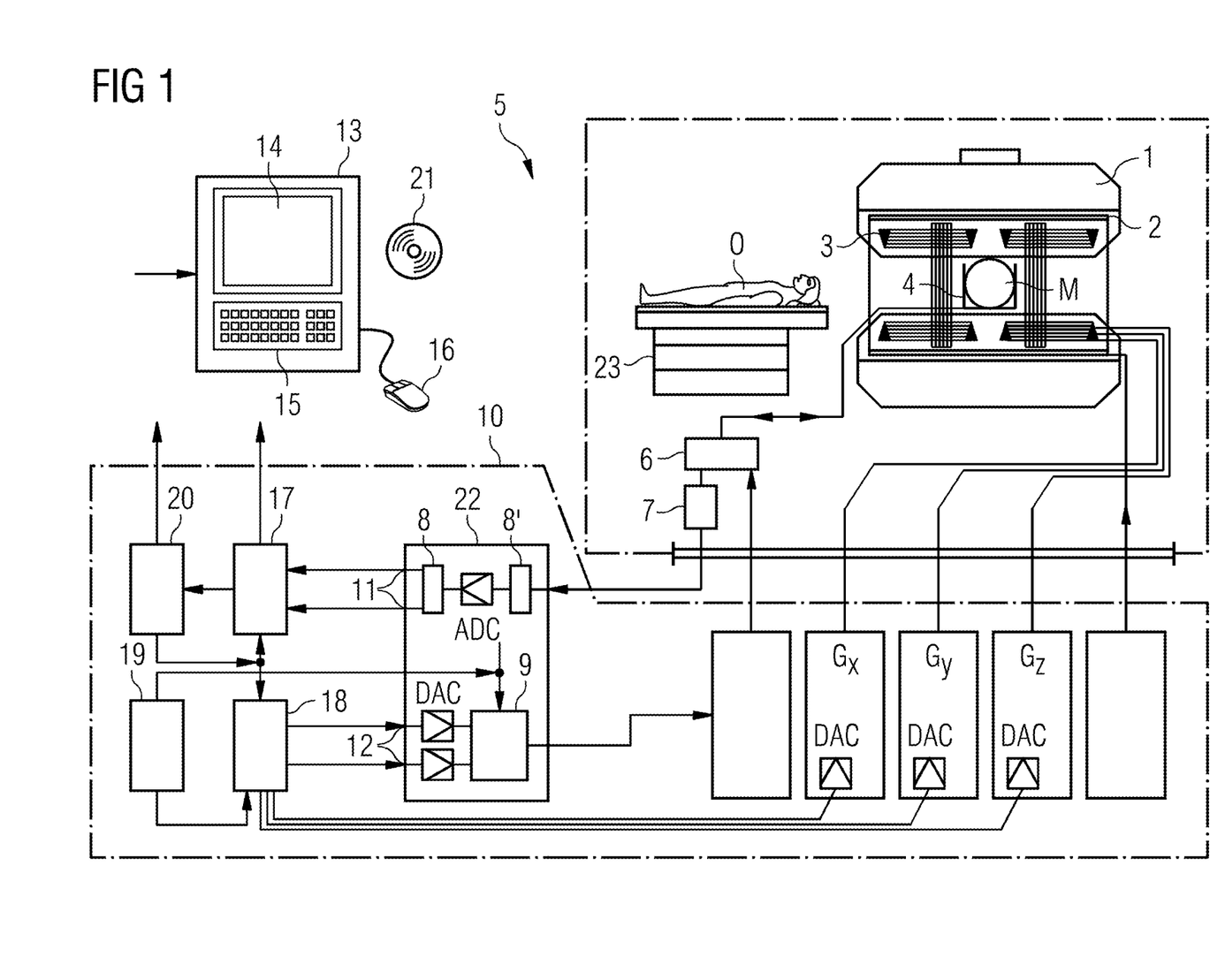
FIG. 1 schematically illustrates a magnetic resonance apparatus according to the invention.

FIG. 1 schematically shows a magnetic resonance apparatus 5 according to the invention (a magnetic resonance imaging or nuclear spin tomography device). Here, a basic field magnet 1 of the scanner in the magnetic resonance system 5 generates a chronologically constant strong magnetic field in order to polarize or orient the nuclear spins in an examination region of an object O, such as, for example, of a part of a human body that is to be examined, which is examined while on a table 23 in the magnetic resonance system 5. The high homogeneity of the basic magnetic field that is required for a nuclear magnetic resonance measurement is defined in a typically spherical measurement volume M, in which the volume segment of the human body that is to be examined in arranged. To support the high homogeneity requirements and in particular to eliminate chronologically invariable influences, "shim plates" of ferromagnetic material are applied. Chronologically variable influences are eliminated by shim coils 2 fed by a shin coils supply 24.

In the basic field magnet 1, a cylindrical gradient field system or gradient field system 3 composed of three windings is used. Each winding is supplied with current an amplifier to generate a linear (also chronologically modifiable) gradient field in the respective direction of the Cartesian coordinate system. The first winding in the gradient field system 3 generates a gradient $G_x$ in the x-direction, the second winding generates a gradient $G_y$ in the y-direction and the third winding generates a gradient $G_z$ in the z-direction. Each amplifier includes a digital-to-analog converter, which is activated by a sequence controller 18 so as to generate gradient pulses at the correct time.

Within the gradient field system 3 is one or more radio frequency antennas 4, which convert the radio frequency pulses emitted by a radio frequency power amplifier 25 into an alternating magnetic field in order to excite the nuclei and orientate the nuclear spins of the object O that is to be examined or of the region of the object O that is to be examined. Each radio frequency antenna 4 has one or more RF transmission coils and one or more RF receiving coils in the form of an annular, preferably linear or matrix-shaped, arrangement of component coils. The RF receiving coils in the respective radio frequency antenna 4 also convert the alternating field emanating from the precessing nuclear spins, that is usually the nuclear spin echo signals generated by a spin echo sequence and one or more magnetic field gradients into a voltage (measurement signal), which is supplied to a radio frequency receiving channel 8 of a radio frequency system 22 via an amplifier 7. The radio frequency system 22, which is part of a control computer 10 of the magnetic resonance system 5, further includes a transmission channel 9, in which the radio frequency pulses to excite and refocus (or invert) the nuclear magnetic resonance are generated on the basis of a spin echo sequence predefined by the system computer 20 in the sequence controller 18. Here the respective radio frequency pulses are represented digitally as a succession of complex numbers. This sequence of numbers is supplied via inputs 12, case as a real and an imaginary number, to a digital-to-analog converter in the radio frequency system 22 and from this to a transmission channel 9. In the transmission channel 9, the spin echo sequences are modulated onto a radio frequency carrier signal, the basic frequency whereof corresponds to the resonant frequency of the nuclear spins in the measured volume.

Switching from transmission to receiving mode is achieved via a duplexer 6. The RF transmission coils in the radio frequency antenna(s) 4 radiate the radio frequency pulses to excite or refocus (invert) the nuclear spins in the measured volume M and the resulting echo signals are sampled via the RF receiving coil(s). The nuclear resonance signals acquired accordingly are demodulated to an intermediate frequency in the receiving channel 8' (first demodulator) of the high frequency system 22 in a phase-sensitive manner, digitalized in the analog-digital converter (ADC) and sent via the output 11. This signal is demodulated again to the 0 frequency. Demodulation to the 0 frequency and splitting into the real and imaginary parts takes place in a second demodulator 8 after digitization in the digital domain. With an image computer 17, an MR image is reconstructed from the measured data thus acquired via an output 11. The management of the measured data, of the image data and of the control programs is achieved via the system computer 20. On the basis of a target set using control programs, the sequence controller 18 monitors the generation of the respective desired pulse sequences and the respective sampling of k-space. In particular, the sequence controller 18 monitors the punctuality with which the gradients are applied, the transmission of the high frequency pulses with a defined phase amplitude, and also the reception of the nuclear magnetic signals. The time basis for the high frequency system 22 and sequence controller 18 is provided by a synthesizer 19. The selection of corresponding control programs for the generation of an MR image, which are stored, for example, on a DVD 21, and the display of the MR image is achieved via a terminal 13, which includes a keyboard 15, a mouse 16 and a screen 14.

Figure 2:
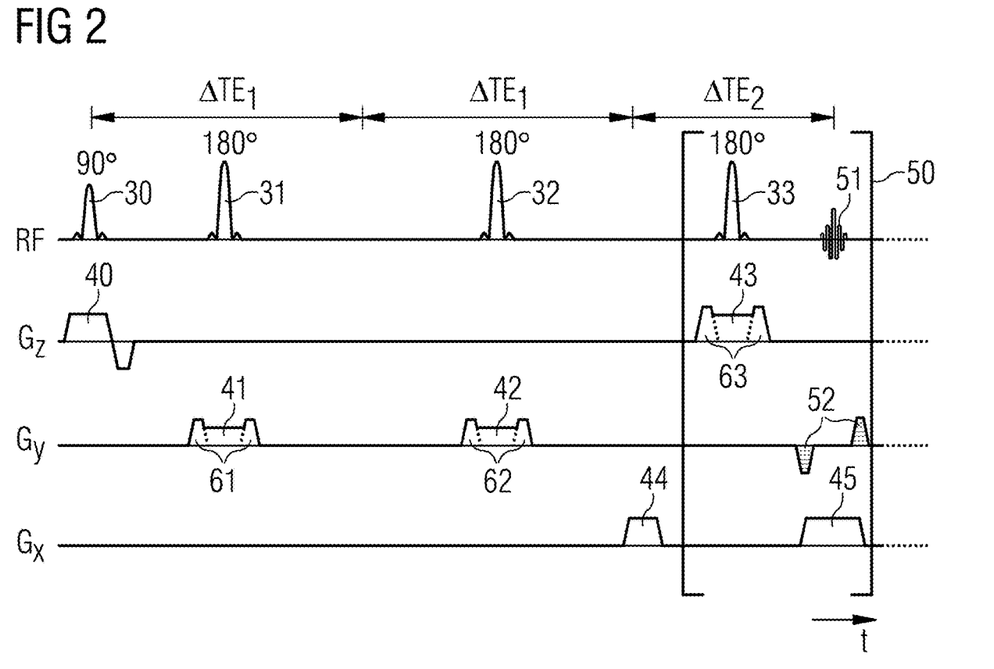
FIG. 2 shows a first variant of a spin echo sequence according to the invention.

FIG. 2 shows a first variant of a spin echo sequence according to the invention.

In this first variant, first an RF excitation pulse 30 (in particular with a flip angle of 90°) is radiated, while a first gradient 40 is applied along a first spatial direction z. Chronologically after the RF excitation pulse, a first refocusing pulse 31 is applied, while at the same time a second gradient 41 is applied along a second spatial direction y. This second spatial direction y is at an angle of 90° to the first spatial direction x. Directly before the second gradient 41 and directly after the second gradient 41, "crusher gradients" 61 are applied. From the time lag between the RF excitation pulse 30 and the first refocusing pulse 31, an echo time $\Delta TE_1$ is determined. Chronologically after the first refocusing pulse 31, a second refocusing pulse 32 is radiated, while at the same time a third gradient 42 is applied along the second direction y. In a similar way to the second gradient 41, crusher gradients 62 are applied directly before the third gradient 42 and directly after the third gradient 42. In particular through the time lag between the first refocusing pulse 31 and the second refocusing pulse 32, the echo time $\Delta TE_1$ is determined. As a rule, the time lag between the first refocusing pulse 31 and the second refocusing pulse 32 is equal to double the time lag between the RF excitation pulse 30 and the first refocusing pulse 31.

In order to be able to detect a number of k-space lines starting from the RF excitation pulse 30, a number of further refocusing pulses 33 are radiated in particular after the second refocusing pulse 32, a further gradient 43 being applied along the first direction z to the respective further refocusing pulse 33. Again, crusher gradients 63 are applied directly before the further gradient 43 and directly after the further gradient 43. Due to the imprecise flip angle of the two refocusing pulses 31, 32, a residual longitudinal magnetization exists after the radiation of these two refocusing pulses 31, 32. The fact that the crusher gradients 61, 62 are selected differently from the crusher gradients 63 with regard to their amplitude and/or direction, this residual longitudinal magnetization can advantageously be eliminated.

Before the MR data 51 is acquired in the form of the echo train 50, a pre-focusing readout gradient 44 is applied along the readout direction x.

In the echo train 50, following the respective further refocusing pulse 33, by means of phase encoding 52, the k-space line to be selected is set and the MR data 51 for this k-space line are acquired while the readout gradient 45 is applied along the third direction or readout direction. The echo train length or the number of further refocusing pulses 33 inside the echo train 50 usually corresponds to the number of k-space lines to be acquired in the respective slice.

The phase encoding 52 can vary, as with RARE or TSE sequences ("Rapid Acquisition with Relaxation Enhancement"—or "Turbo-Spin-Echo" sequences), but it can also be consistent. In a similar way, the echo times $\Delta TE_2$ during the same echo train can also be the same or can vary (as with "Multi-Echo-Imaging", for example).

Furthermore, the flip angle of the further refocusing pulses may differ from 180° and may vary within the same echo train. Even the relative time position for the signal acquisition (that is, the mean value from the time lag between the further refocusing pulse 33 and the start of the readout gradient 45 and the time lag between the further refocusing pulse 33 and the end of the readout gradient 45) may vary, as is the case, for example, with a DIXON method.

Figure 3:
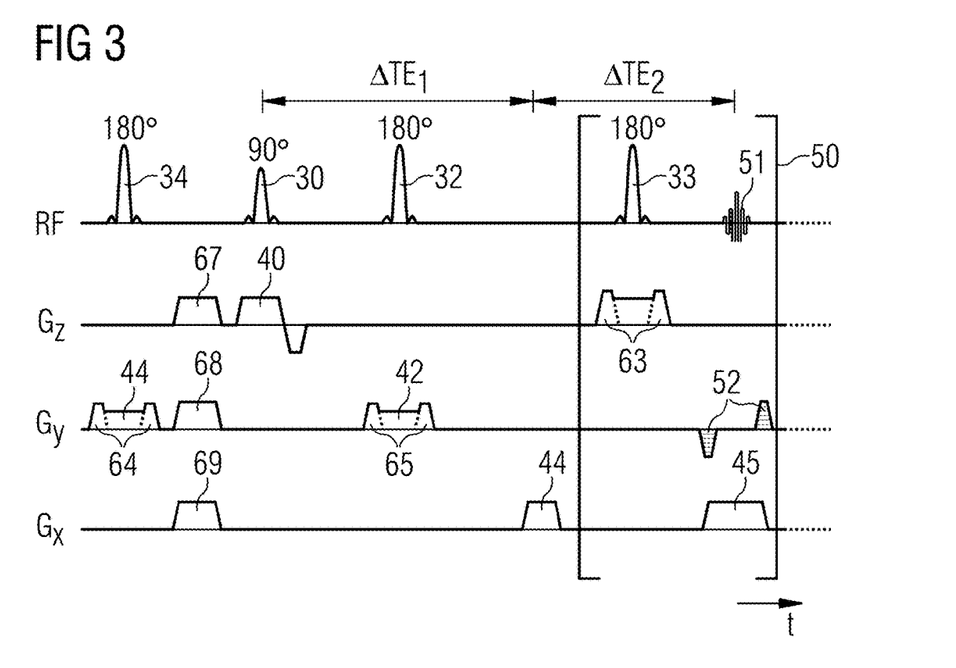
FIG. 3 shows a second variant of a spin echo sequence according to the invention.

FIG. 3 shows a second variant of a spin echo sequence according to the invention.

In this second variant, first an inversion pulse 34 is radiated while at the same time a gradient 44 is applied along the second direction y. An RF excitation pulse 30 is only applied after the inversion pulse 34, while at the same time a slice selection gradient 40 is applied along the first direction z. After the RF excitation pulse 30, a refocusing pulse 32 is applied, while at the same time a gradient 42 is applied along the second direction y. After the refocusing pulse 32, the acquisition of the MR data ensues in the same way in the form of an echo train 50, as described with reference to the first variant (see FIG. 2). In the second variant, the same variations may occur as were described for the first variant.

As with the first variant, in the second variant, crusher gradients 64, 65 are applied directly before and directly after the inversion pulse 34 and the refocusing pulse 32 and likewise crusher gradients 63 are applied directly before and directly after the further refocusing pulse 33, which gradients have the same role as in the first variant.

In the second variant, the echo time $\Delta TE_1$ results from the time lag between the RF excitation pulse 30 and the refocusing pulse 32. As in the first variant, the echo time $\Delta TE_2$ during the echo train 50 can be the same as or different from the echo time $\Delta TE_1$. In the second variant too, the echo time $\Delta TE_2$ may vary within the same echo train or remain constant.

Between the inversion pulse 34 and the RF excitation pulse 30, so-called spoiler gradients 67-69 are applied in order to eliminate a residual transverse magnetization after the inversion pulse 34.

The present invention is described hereinafter with the use of FIG. 4.

After the radiation of the first RF excitation pulse 30 and of the two refocusing pulses 31, 32 (in the first variant) and of the inversion pulse 34 and the refocusing pulse 32 (in the second variant), the spins in the specified slice 71 are flipped out of their starting position by the RF excitation pulse 30 by the flip angle (90° according to FIGS. 2 and 3). In addition, the spins in the further slice 72 are inverted twice by the two refocusing pulses 31, 32 or by the inversion pulse 34 and the refocusing pulse 32. Since the specified slice 71 and the further slice 72 are at a specific angle to each other (90° in FIG. 4), the spins in the intersection volume 73 are both flipped out of their starting position by the flip angle of the RF excitation pulse 30 and are also inverted twice.

Therefore, whereas the spins in the further slice 72 are flipped (inverted) from their starting position 85 by the inversion pulse 34 or the first refocusing pulse 31 into a position 86 and are subsequently flipped back again (inverted) by a (second) refocusing pulse 32 into a position 87 that corresponds with the starting position 85, the spins in the intersection volume 73 additionally experience the RF excitation pulse 30. Therefore, the spins in the intersection volume 73 are first flipped out of their starting position 81 by the flip angle of (for example, 90°) into position 82, then inverted into position 83 and finally returned to a position 84, which corresponds to position 82.

Figure 4:
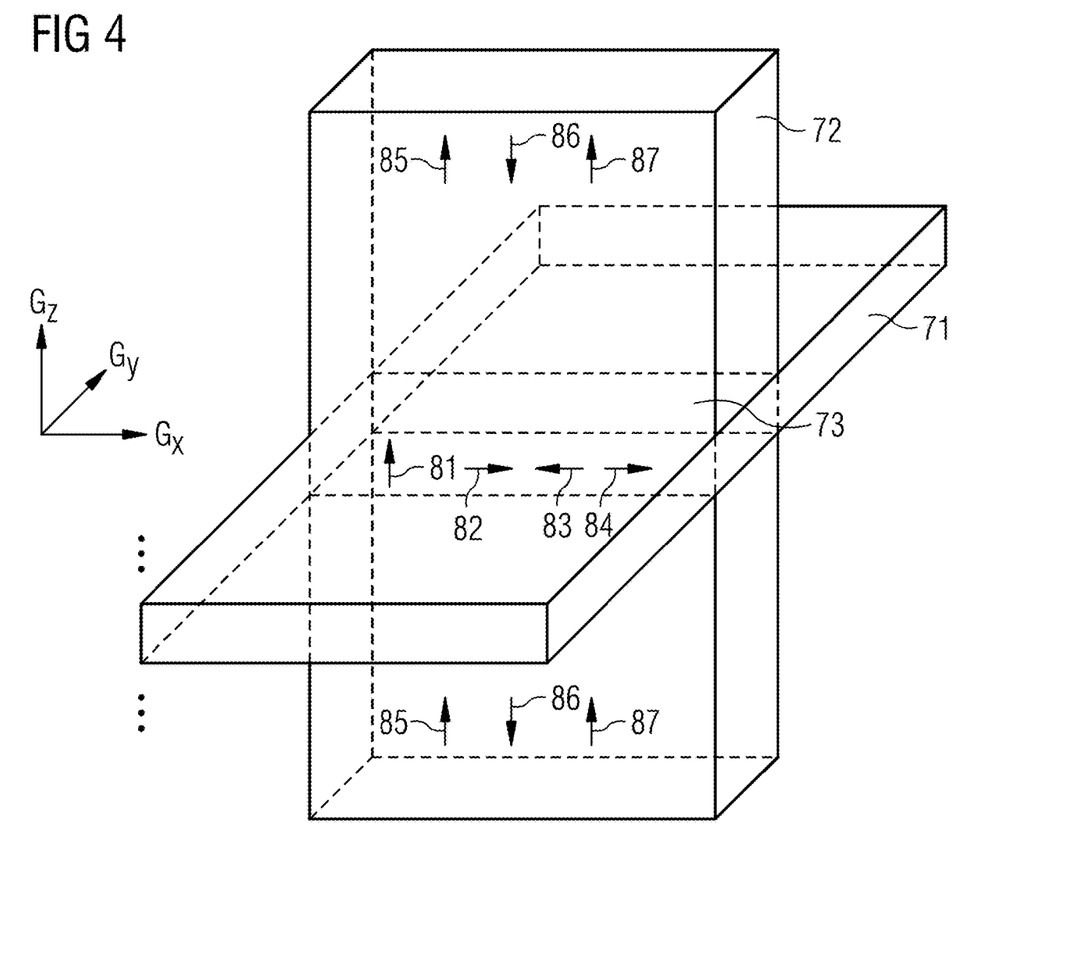
FIG. 4 shows a slice excited with an RF excitation pulse and a slice that has twice been selectively refocused.

The adjacent slices (not shown in FIG. 4) which run parallel to the specified slice 71 and in which MR data are acquired according to the invention after the acquisition of the MR data in the specified slice 71, experience only the effects shown in FIG. 4 with respect to the further slice 72. This means that the spins in a further intersection volume, which corresponds to an intersection of a specific adjacent slice with the further slice 72, are only inverted twice so that they are again in their starting position. Therefore, the double inversion of the spin echo sequence according to the invention does not have any negative effects on the slices adjacent to the specified slice 71, such that the MR data for any adjacent slice can ensue immediately after the acquisition of the MR data in the specified slice.

Figure 5:
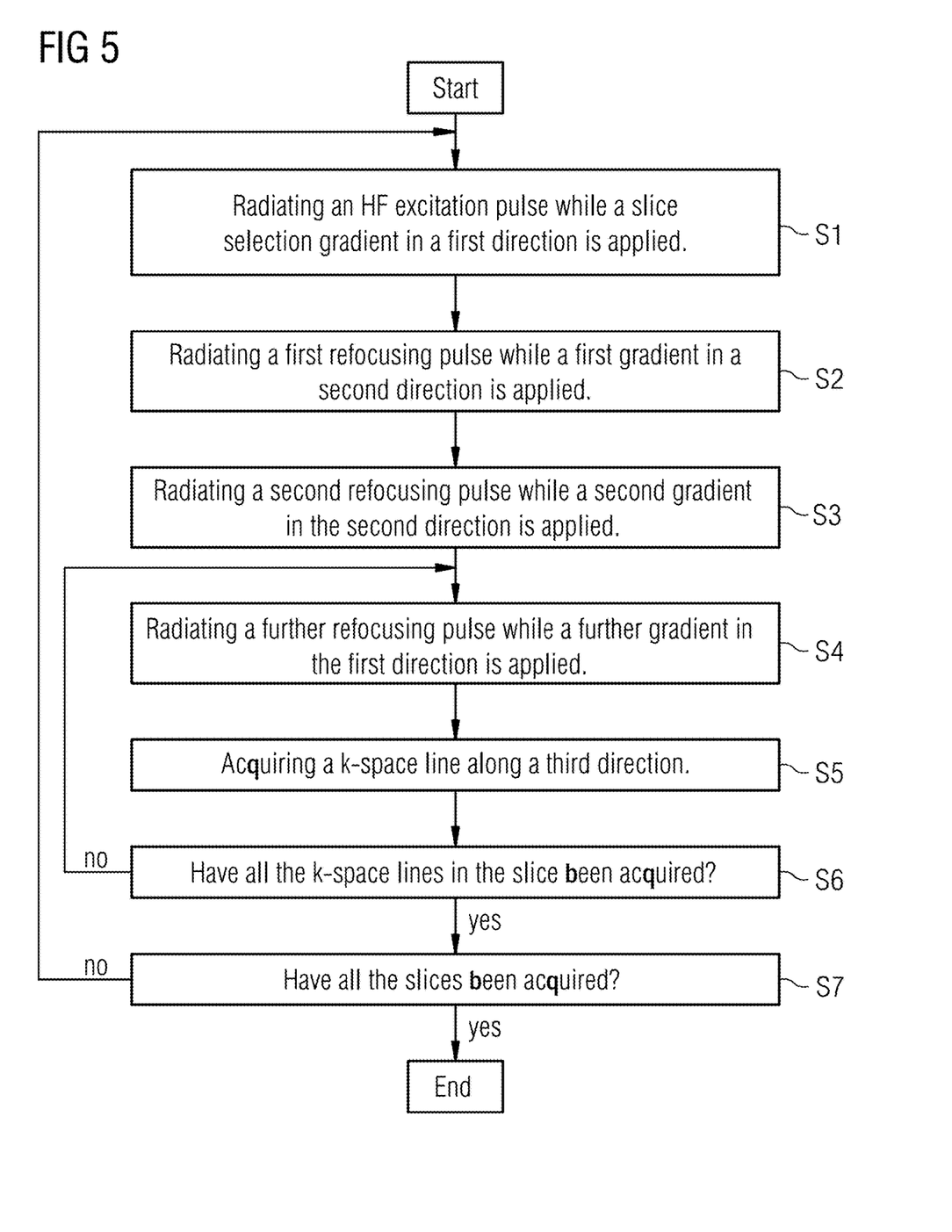
FIG. 5 is a flowchart for a first variant of the spin echo sequence according to the invention.

FIG. 5 shows the workflow for the acquisition of MR data according to the first variant of the spin echo sequence according to the invention.

In a first step S1, an RF excitation pulse is radiated while a slice selection gradient is applied in a first direction. Next, in a second step S2, a first refocusing pulse is radiated while a first gradient in a second direction is applied. The first and the second directions form an angle of (for example, 90°). Finally, in the third step S3, a second refocusing pulse is radiated, while a second gradient is applied along the second direction.

The subsequent data acquisition ensues in the form of an echo train. For this purpose, in step S4, a refocusing pulse is radiated, while a further gradient in the first direction is applied. Next, a k-space line is acquired along a third direction with the aid of a readout gradient. With Cartesian MR data acquisition, the third direction is perpendicular to the first and the second direction. Steps S4 and S5 are repeated until all k-space lines for the respective slice have been acquired. If it is detected in step S6 that all the k-space lines in the respective slice have been acquired, a check is carried out in step S7 as to whether all the slices have already been acquired. If this is not yet the case, the method reverts to step S1.

Figure 6:
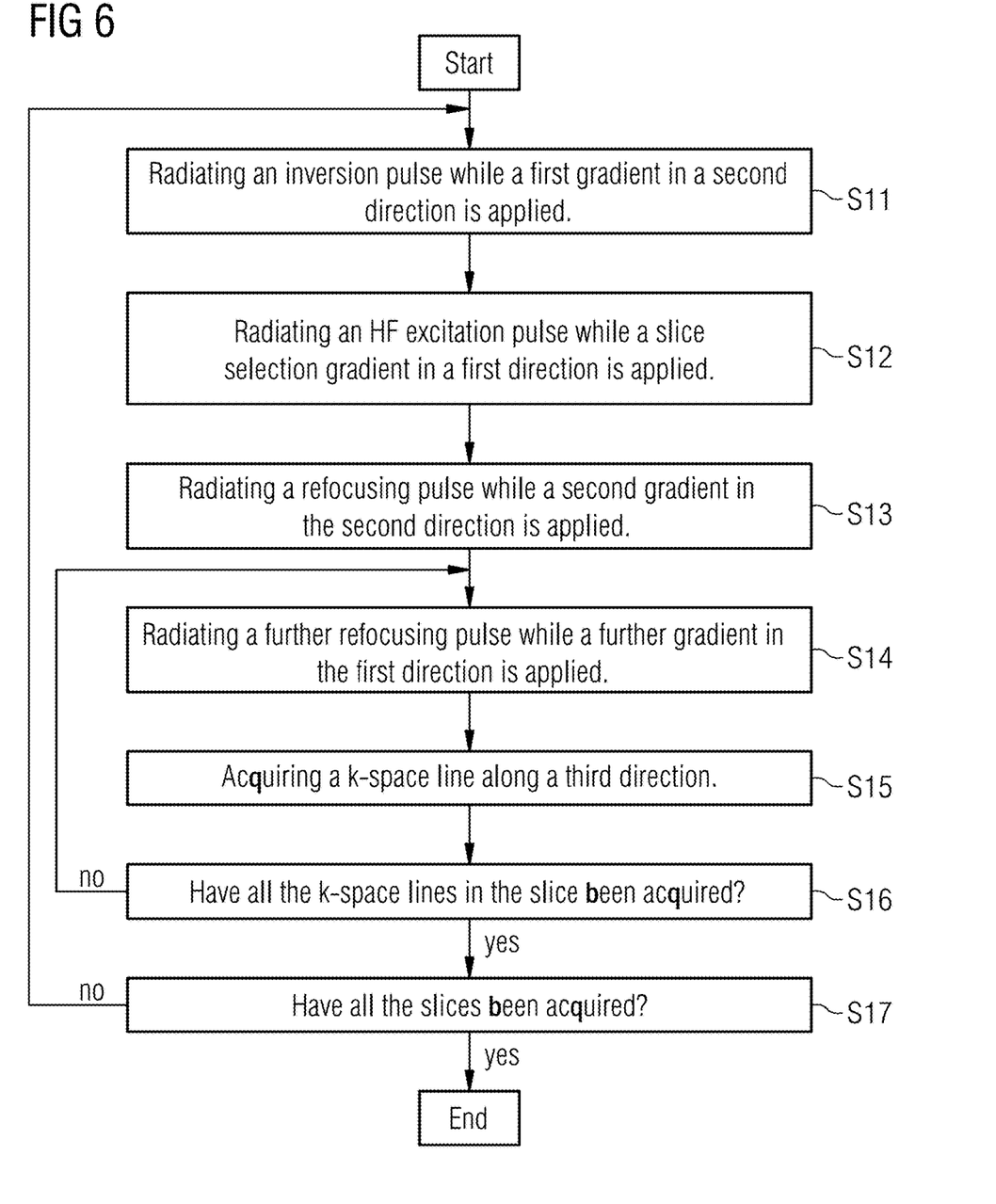
FIG. 6 is a flowchart for the second variant of the spin echo sequence according to the invention.

In FIG. 6, the workflow for the acquisition of MR data according to the second variant of the spin echo sequence as per the invention is shown.

In the first step S11, an inversion pulse is radiated while a first gradient in the second direction is applied. In the subsequent step S12, the RF excitation pulse is radiated while a slice selection gradient in the first direction is applied. In the subsequent step S13, a refocusing pulse is radiated while a second gradient in the second direction is applied.

The acquisition of the MR data ensues in the context of an echo train in a similar way as with the first variant (see FIG. 5). In order to acquire a k-space line, in step S14 a further refocusing pulse is radiated while a further gradient in the first direction is applied. Next, the k-space line along a third direction is acquired by applying the readout gradient. If it is detected in step S16 that not yet all the k-space lines in the respective slice have been acquired, the method reverts to step S14. Otherwise a check is carried out in step S17 as to whether all the slices have already been acquired. If this is the case, the acquisition of MR data is complete, and otherwise the method reverts to step S11.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance (MR) data, comprising:

with a computer, operating an MR data acquisition scanner of an MR imaging apparatus in order to execute a spin echo sequence, which includes applying a first gradient along a first direction and radiating a radio frequency (RF) excitation pulse that selectively excites one slice, among a plurality of slices in a predetermined volume segment of an examination subject, while the first gradient is applied, said RF excitation pulse flipping nuclear spins in said one of said slices so as to cause said nuclear spins to deviate from a starting position;

with said computer, operating said MR data acquisition scanner, also in said spin echo sequence, in order to apply a second gradient along a second direction that forms an angle in a range between 45° and 135° with said first direction, and to radiate a refocusing pulse, while the second gradient is applied, in order to invert nuclear spins in a further slice in said plurality of slices that forms said angle with said one of said slices and that thereby forms an intersection volume comprising an intersection of said one of said slices with said further slice;

with said computer, operating said MR data acquisition scanner in order to apply a third gradient along said second direction, and to radiate a further RF pulse while the third gradient is applied, so as to invert spins in said further slice, with nuclear spins in slices, in said plurality of slices, that are parallel to said one of said slices, and thus outside of said intersection volume, being flipped back to said starting position by the combination of the refocusing pulse and the further RF pulse, and thereby causing nuclear spins in said intersection volume to be manipulated by said RF excitation pulse, said refocusing pulse and said further RF pulse, with nuclear spins outside of said examination volume, but inside said further slice, being manipulated only by said refocusing pulse and said further RF pulse;

with said computer, operating said MR data acquisition scanner, also in said spin echo sequence, to acquire MR data originating from the nuclear spins in said intersection volume and to enter the acquired MR data into a memory organized as k-space along at least one k-space line, only after radiating said RF excitation pulse, said refocusing pulse and said further RF pulse; and via said computer, making the MR data entered into k-space available in electronic form, as a data file.

2. A method as claimed in claim 1 comprising, with said computer, operating said MR data acquisition scanner, in said spin echo sequence, in order to apply crusher gradients in said second direction, respectively immediately before and immediately after applying said second gradient and immediately before and immediately after applying said third gradient.

3. A method as claimed in claim 1 comprising, with said computer, operating said MR data acquisition scanner, in said spin echo sequence, in order to apply a pre-focusing readout gradient before acquiring the MR data that are entered into said at least one k-space line.

4. A method as claimed in claim 1 comprising, with said computer, operating said MR data acquisition scanner, in said spin echo sequence, to radiate said refocusing pulse and said further RF pulse each as an adiabatic pulse, and thereby reducing a sensitivity of said MR data to inhomogeneities in RF fields in said MR data acquisition scanner.

5. A method as claimed in claim 1 comprising, with said computer, operating said MR data acquisition scanner, in said spin echo sequence in order to acquire MR data from other slices in said plurality of slices, after acquiring the MR data from said intersection volume in said one of said slices, said other slices being spaced at intervals from said one of said slices along said first direction.

6. A method as claimed in claim 1 comprising entering the MR data acquired from said intersection volume into a plurality of k-space lines in k-space by, with said computer, operating said MR data acquisition scanner in said spin echo sequence in order to:

apply a readout gradient along said third direction;

acquiring the MR data for each k-space line while the readout gradient is applied; and after the readout gradient has been applied and MR data for a respective k-space line have been acquired, radiating another refocusing pulse after radiating the further refocusing pulse.

7. A method as claimed in claim 6 comprising entering the MR data into the k-space lines according to a Cartesian trajectory, wherein said k-space lines are parallel to each other.

8. A method as claimed in claim 7 comprising applying said third gradient along said first direction while said another refocusing pulse is radiated.

9. A method as claimed in claim 8 comprising applying crusher gradients respectively immediately before and immediately after applying said third gradient.

10. A method as claimed in claim 9 wherein said crusher gradients are second crusher gradients, and also applying first crusher gradients respectively immediately before and immediately after applying said second gradient and immediately before and immediately after applying said third gradient, wherein said second crusher gradients have an amplitude that differs from an amplitude of said first crusher gradients.

11. A method as claimed in claim 6 comprising reading out said MR data during an echo time, determined by said further refocusing pulse, that is constant during the acquisition of said k-space lines.

12. A method as claimed in claim 6 comprising acquiring said MR data for said k-space lines with a same phase encoding.

13. A method as claimed in claim 6 comprising acquiring the MR data entered into a first line in said k-space lines without previously radiating one of said further refocusing pulses.

14. A method as claimed in claim 1 comprising, with said computer, operating said MR data acquisition scanner in said spin echo sequence in order to first radiate said RF excitation pulse and to radiate said refocusing pulse after said RF excitation pulse and to radiate said further RF pulse after said refocusing pulse.

15. A method as claimed in claim 14 comprising reading out said MR data during a first echo time determined from said further RF pulse, which defers from a second echo time determined by said further refocusing pulse.

16. A method as claimed in claim 1 comprising, with said computer, operating said MR data acquisition scanner in said spin echo sequence in order to first radiate said further RF pulse and to radiate said RF excitation pulse after said further RF pulse, and to radiate said refocusing pulse after said RF excitation pulse.

17. A method as claimed in claim 16 comprising, with said computer, operating said MR data acquisition scanner in said spin echo sequence in order to apply at least one spoiler gradient between said further RF pulse and said RF excitation pulse, in order to eliminate signal components of a residual transverse magnetization of said nuclear spins after said further RF pulse.

18. A method as claimed in claim 17 comprising acquiring said MR data during a first echo time determined from said refocusing pulse, which defers from a second echo time determined from said further refocusing pulse.

19. A magnetic resonance (MR) imaging apparatus comprising:

an MR data acquisition scanner;

a computer configured to operate said MR data acquisition scanner in order to execute a spin echo sequence, which includes applying a first gradient along a first direction and radiating a radio frequency (RF) excitation pulse that selectively excites one slice, among a plurality of slices in a predetermined volume segment of an examination subject, while the first gradient is applied, said RF excitation pulse flipping nuclear spins in said one of said slices so as to cause said nuclear spins to deviate from a starting position;

said computer being configured to operate said MR data acquisition scanner, also in said spin echo sequence, in order to apply a second gradient along a second direction that forms an angle in a range between 45° and 135° with said first direction, and to radiate a refocusing pulse, while the second gradient is applied, in order to invert nuclear spins in a further slice in said plurality of slices that forms said angle with said one of said slices and that thereby forms an intersection volume comprising an intersection of said one of said slices with said further slice;

said computer being configured to operate said MR data acquisition scanner in order to apply a third gradient along said second direction, and to radiate a further RF pulse while the third gradient is applied, so as to invert spins in said further slice, with nuclear spins in slices, in said plurality of slices, that are parallel to said one of said slices, and thus outside of said intersection volume, being flipped back to said starting position by the combination of the refocusing pulse and the further RF pulse, and thereby causing nuclear spins in said intersection volume to be manipulated by said RF excitation pulse, said refocusing pulse and said further RF pulse, with nuclear spins outside of said examination volume, but inside said further slice, being manipulated only by said refocusing pulse and said further RF pulse;

said computer being configured to operate said MR data acquisition scanner, also in said spin echo sequence, to acquire MR data originating from the nuclear spins in said intersection volume and to enter the acquired MR data into a memory organized as k-space along at least one k-space line, only after radiating said RF excitation pulse, said refocusing pulse and said further RF pulse; and said computer being configured to make the MR data entered into k-space available in electronic form, as a data file.

20. A non-transitory, computer-readable data storage medium encoded with programming instructions, said storage medium being loaded into a computer system of a magnetic resonance (MR) imaging apparatus that comprises an MR data acquisition scanner, said programming instructions causing said computer system to:

operate the MR data acquisition scanner in order to execute a spin echo sequence, which includes applying a first gradient along a first direction and radiating a radio frequency (RF) excitation pulse that selectively excites one slice, among a plurality of slices in a predetermined volume segment of an examination subject, while the first gradient is applied, said RF excitation pulse flipping nuclear spins in said one of said slices so as to cause said nuclear spins to deviate from a starting position;

operate the MR data acquisition scanner, also in said spin echo sequence, in order to apply a second gradient along a second direction that forms an angle in a range between 45° and 135° with said first direction, and to radiate a refocusing pulse, while the second gradient is applied, in order to invert nuclear spins in a further slice in said plurality of slices that forms said angle with said one of said slices and that thereby forms an intersection volume comprising an intersection of said one of said slices with said further slice;

operate the MR data acquisition scanner in order to apply a third gradient along said second direction, and to radiate a further RF pulse while the third gradient is applied, so as to invert spins in said further slice, with nuclear spins in slices, in said plurality of slices, that are parallel to said one of said slices, and thus outside of said intersection volume, being flipped back to said starting position by the combination of the refocusing pulse and the further RF pulse, and thereby causing nuclear spins in said intersection volume to be manipulated by said RF excitation pulse, said refocusing pulse and said further RF pulse, with nuclear spins outside of said examination volume, but inside said further slice, being manipulated only by said refocusing pulse and said further RF pulse;

operate the MR data acquisition scanner, also in said spin echo sequence, to acquire MR data originating from the nuclear spins in said intersection volume and to enter the acquired MR data into a memory organized as k-space along at least one k-space line, only after radiating said RF excitation pulse, said refocusing pulse and said further RF pulse; and make the MR data entered into k-space available in electronic form, as a data file.

* * * * *